(12) United States Patent
Liu et al.

(10) Patent No.: US 7,915,721 B2
(45) Date of Patent: Mar. 29, 2011

(54) SEMICONDUCTOR DIE PACKAGE INCLUDING IC DRIVER AND BRIDGE

(75) Inventors: Yong Liu, Scarborough, ME (US); Jiangyuan Zhang, Jiangsu (CN); Qiuxiao Qian, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 496 days.

(21) Appl. No.: 12/046,734

(22) Filed: Mar. 12, 2008

(65) Prior Publication Data
US 2009/0230518 A1 Sep. 17, 2009

(51) Int. Cl.
*H01L 23/02* (2006.01)

(52) U.S. Cl. ........................ 257/678; 257/666

(58) Field of Classification Search .................. 257/177, 257/666, 678, 684, 685, 686, 692, 693, 713, 257/723, 728, 777, 778, 784, 786, 796, E23.01, 257/E23.021, E23.026, E23.034, E23.044, 257/E23.047, E23.063, E23.071, E23.085, 257/E23.124, E25.015, E25.018, E25.027
See application file for complete search history.

(56) References Cited

U.S. PATENT DOCUMENTS

| | | | |
|---|---|---|---|
| 4,390,771 A | 6/1983 | Kurtz et al. | |
| 4,476,366 A | 10/1984 | Kurtz et al. | |
| 4,482,794 A | 11/1984 | Kurtz et al. | |
| 4,680,613 A | 7/1987 | Daniels et al. | |
| 4,933,743 A | 6/1990 | Thomas et al. | |
| 5,000,818 A | 3/1991 | Thomas et al. | |
| 5,072,275 A | 12/1991 | Vora | |
| 5,117,276 A | 5/1992 | Thomas et al. | |
| 5,340,762 A | 8/1994 | Vora | |
| 6,893,901 B2 | 5/2005 | Madrid | |
| 7,023,077 B2 | 4/2006 | Madrid | |
| 7,057,907 B2 | 6/2006 | Oh | |
| 7,205,724 B2 | 4/2007 | Ahn et al. | |
| 7,285,849 B2 | 10/2007 | Cruz et al. | |
| 7,317,444 B2 | 1/2008 | Chang | |
| 7,457,140 B2 | 11/2008 | Klein | |
| 7,531,966 B2 | 5/2009 | Hwang et al. | |
| 2005/0218825 A1* | 10/2005 | Chiou | 315/209 R |
| 2005/0224945 A1 | 10/2005 | Saito et al. | |
| 2007/0215996 A1* | 9/2007 | Otremba | 257/678 |
| 2007/0262346 A1* | 11/2007 | Otremba et al. | 257/177 |
| 2008/0061396 A1 | 3/2008 | Havanur | |
| 2009/0108467 A1* | 4/2009 | Otremba | 257/777 |

OTHER PUBLICATIONS

Datasheet for Fairchild Semiconductor LCD Backlight Inverter Drive Integrated Circuit, FAN7310, May 2007, pp. 1-11.
Notification of Transmittal of the International Search Report and The Written Opinion of the International Searching Authority, or the Declaration from International Application No. PCT/US2009/036290 dated Sep. 3, 2009, 13 pages.

* cited by examiner

*Primary Examiner* — Thomas L Dickey
(74) *Attorney, Agent, or Firm* — Kilpatrick Townsend & Stockton LLP

(57) ABSTRACT

A semiconductor die package. Embodiments of the semiconductor die package are usable in backlight circuitry. Systems in packages may include a bridge circuit or a part thereof, and a integrated circuit die, such as a driver die, encapsulated by a molding material or other package. The bridge circuit may be stacked on opposing surfaces of a leadframe.

20 Claims, 18 Drawing Sheets

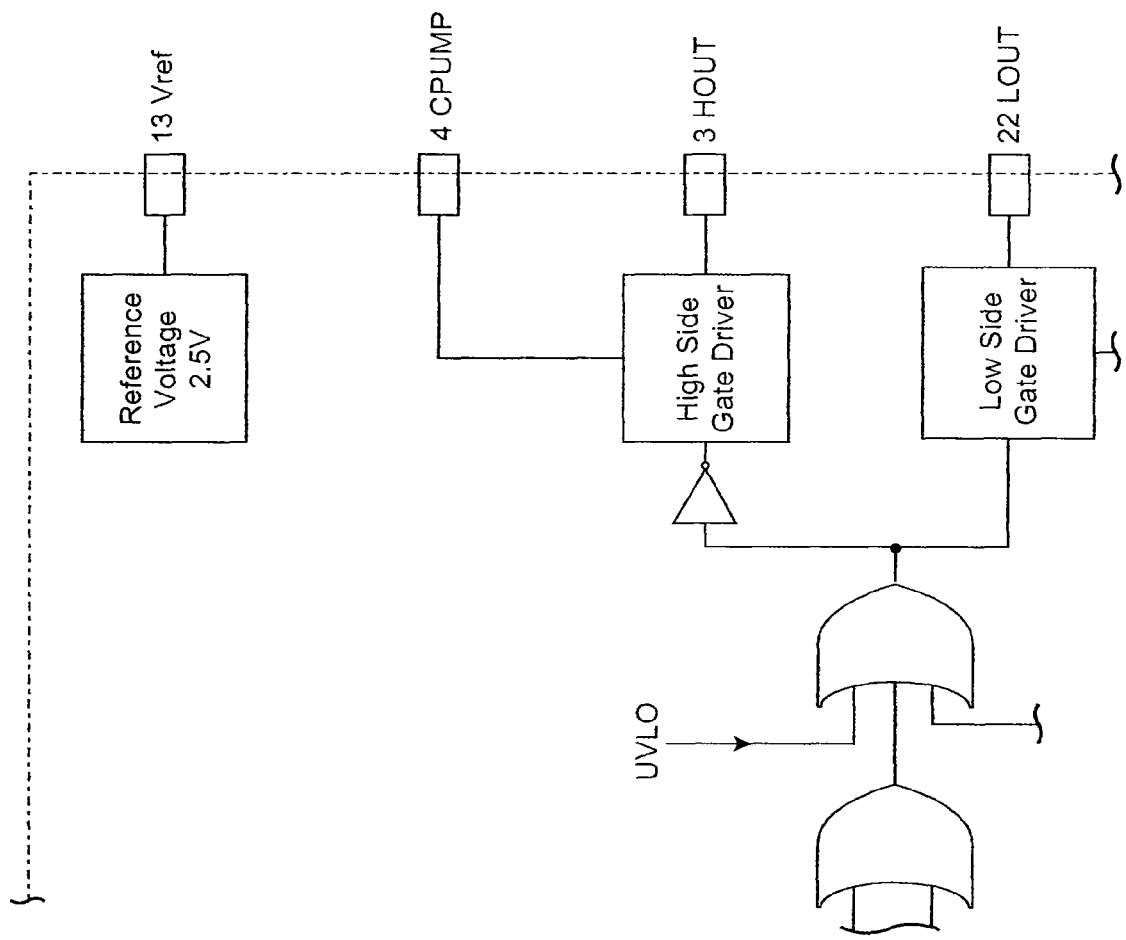
FIG. 3A (Cont.1)

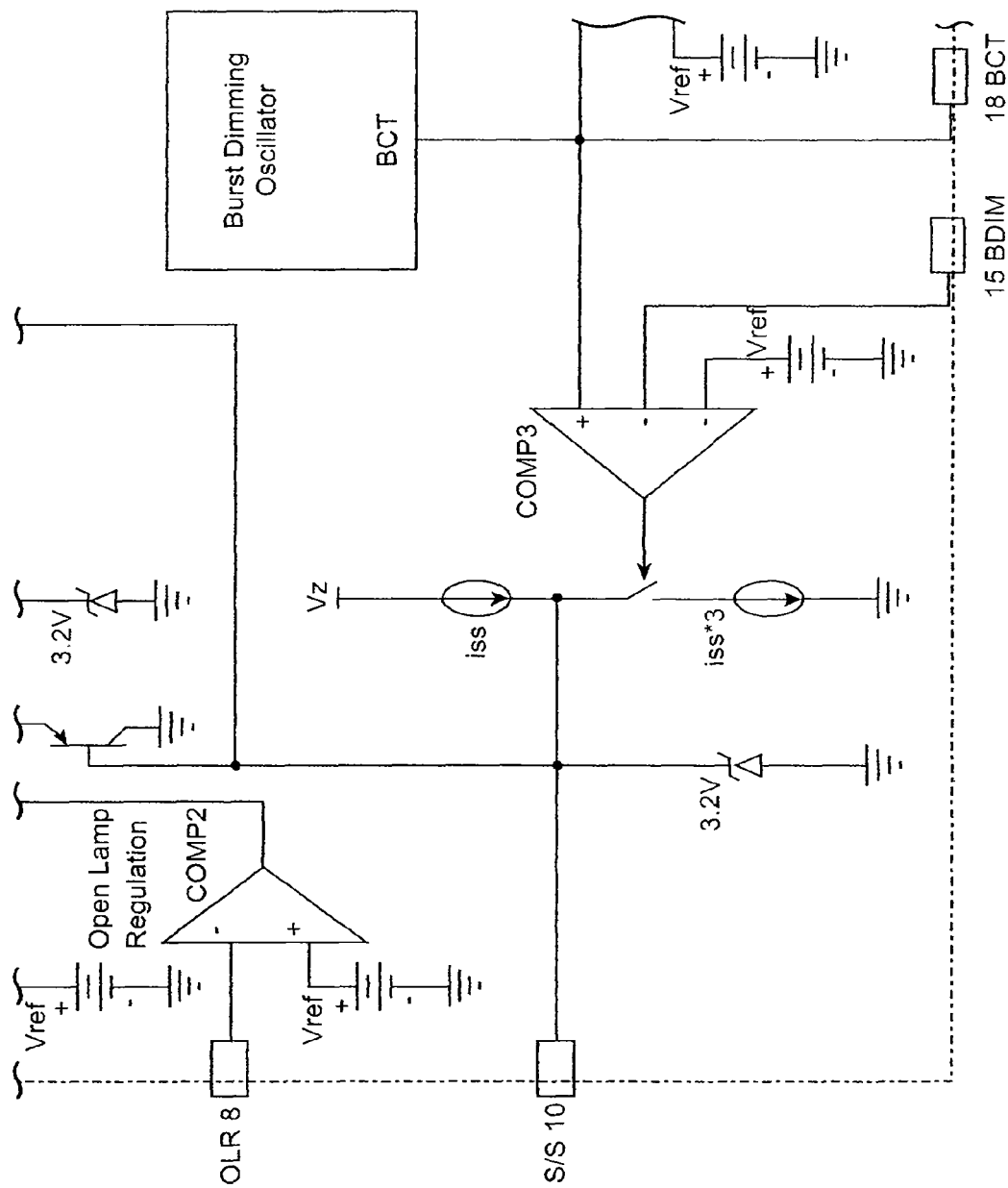
FIG. 3A (Cont.2)

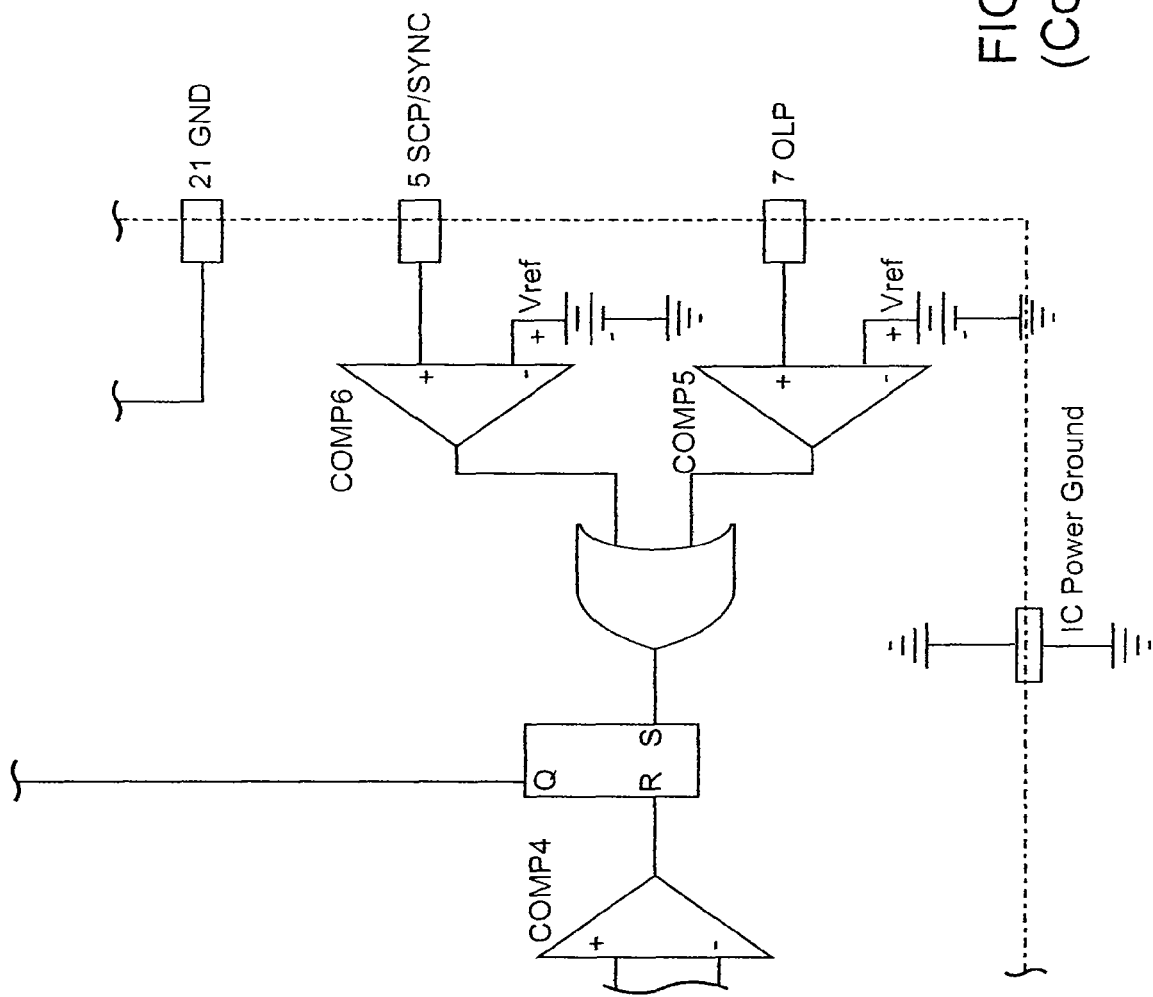
FIG. 3A (Cont.3)

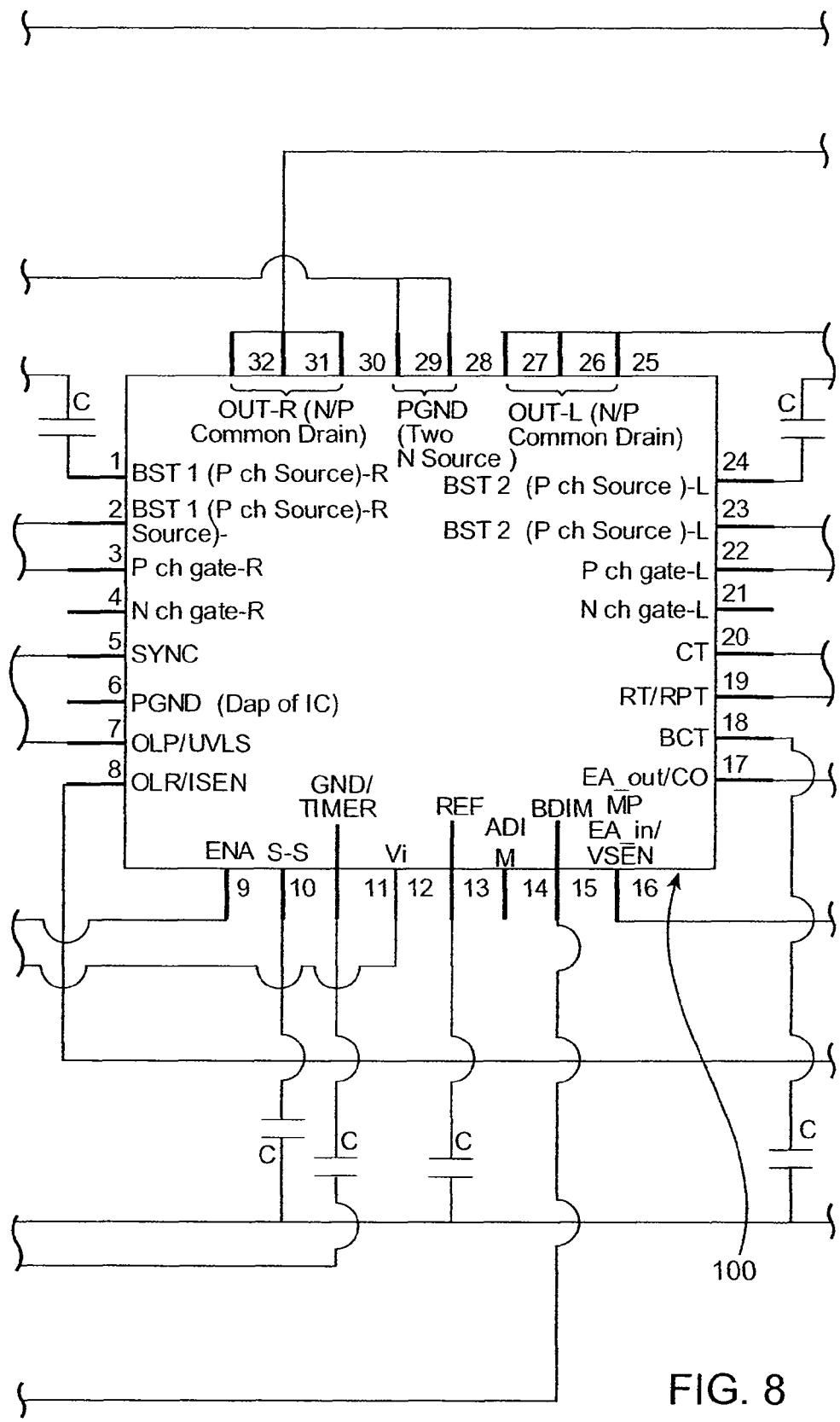
FIG. 8 (Cont.1)

(Cont.2)

SEMICONDUCTOR DIE PACKAGE INCLUDING IC DRIVER AND BRIDGE

CROSS-REFERENCES TO RELATED APPLICATIONS

NOT APPLICABLE

BACKGROUND

Display sets contain various electronics for control of the set, picture generation, and other display functions. Liquid Crystal Displays (LCD) are widely used for various display applications, such as for computer monitors, personal digital devices, televisions, etc. An LCD system uses a liquid crystal panel comprising individual pixels. These pixels can be controlled by electronics within the LCD to create a picture. Some LCD systems use ambient light to display images. Other systems use an additional light source, such as a backlight. A backlight is used in an LCD system to illuminate the liquid crystal panel such that it can produce a viewable image. A backlight can include lamps, such as a cold cathode fluorescent lamps (CCFL) for producing light, and also an inverter for driving the lamps.

Current demands in the industry are for space efficiencies, as displays get thinner. The continuing shrinkage of displays requires increasingly small system electronics. Furthermore, the variations in size and power requirements of display systems are becoming more pronounced. Creating suitably compact electronics that are flexible enough to work with a variety of systems is technically difficult and can be cost prohibitive. It would be desirable to provide a way to address these demands.

Embodiments of the invention address this problem and other problems, individually and collectively.

BRIEF SUMMARY

Embodiments of the invention are directed to systems in packages, methods for making systems in packages, as well as electrical assemblies and systems using such systems in packages.

One embodiment of the invention is directed to a semiconductor die package comprising: a leadframe structure; an integrated circuit die attached to the leadframe structure; a plurality of semiconductor dice comprising a plurality of active devices attached to the leadframe structure, wherein the plurality of semiconductor dice form at least part of a bridge circuit.

Another embodiment of the invention is directed to a method of forming a semiconductor die package, the method comprising: obtaining a leadframe structure; attaching a plurality of semiconductor dice comprising a plurality of active devices to the leadframe structure, wherein the plurality of active devices form at least part of a bridge circuit; and attaching an integrated circuit die to the leadframe structure.

Another embodiment of the invention is directed to a semiconductor die package comprising: a leadframe structure; and a plurality of transistors attached to the leadframe structure, wherein the plurality of transistors form a full bridge circuit.

Another embodiment of the invention is directed to a method of forming a semiconductor die package, the method comprising: obtaining a leadframe structure; and attaching a plurality of transistors to the leadframe structure, wherein the plurality of active devices form a full bridge circuit.

These and other embodiments of the invention are described in detail in the Detailed Description with reference to the Figures. In the Figures, like numerals may reference like elements and descriptions of some elements may not be repeated.

DETAILED DESCRIPTION

Embodiments of the invention are directed to semiconductor die packages and methods of making the same. In a preferred embodiment, the semiconductor die package includes a leadframe structure, an integrated circuit die attached to the leadframe structure, and a plurality of semiconductor dice attached to the leadframe structure. The plurality of semiconductor dice may comprise a plurality of active devices, and the active devices may form at least part of a bridge circuit. The bridge circuit may comprise two half bridge devices, wherein one half bridge device can be attached to one surface of the leadframe structure and the other half bridge device can be attached to an opposite surface of the leadframe structure. The semiconductor die package can be used with an application circuit such as in an LCD backlight inverter.

Other features of embodiments of the invention are described in further detail below with references to the figures.

Figure 2:
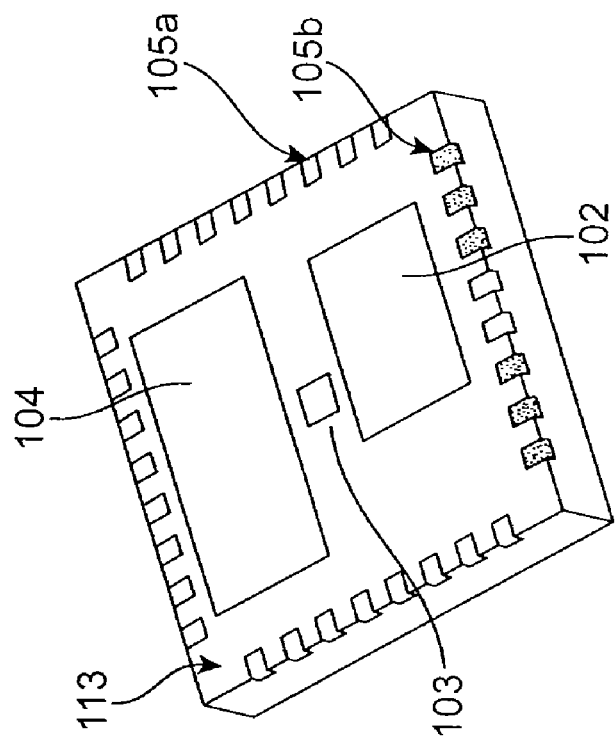
FIG. 2 shows a bottom perspective view of a first embodiment of a semiconductor package.
Figure 1:
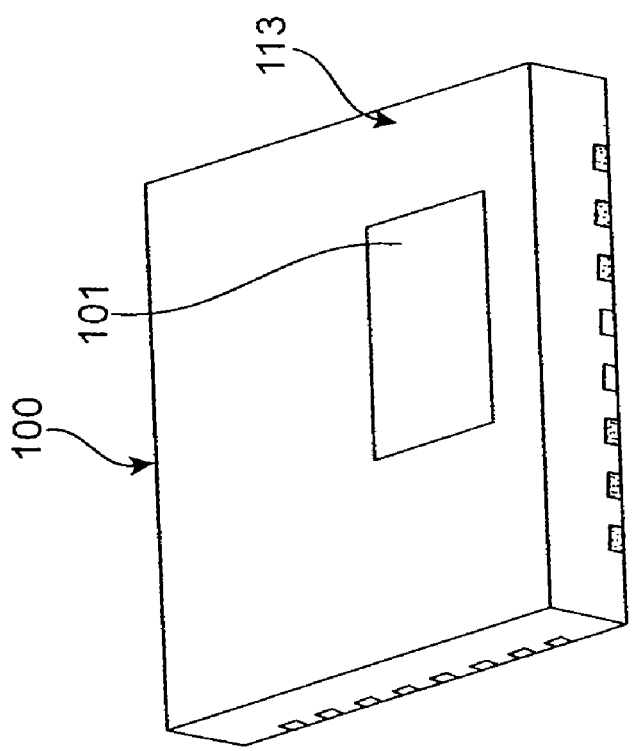
FIG. 1 shows a top perspective view of a first embodiment of a semiconductor package.

FIGS. 1 and 2 respectively show top and bottom perspective views of a first embodiment of a semiconductor package 100. FIGS. 1 and 2 illustrate a molded leadless type package (an MLP type package), or a "Quad Flat No-Lead" or QFN package. It is understood that embodiments of the invention can include other types of package configurations including leaded package configurations.

The semiconductor die package 100 can be include a molding material 113 (such as an epoxy molding material, or other suitable molding material) that can cover and protect the semiconductor dice inside of the semiconductor die package 100.

A number of surfaces of internal components can be exposed through the molding material 113. This makes the resulting package thinner and also facilitates the dissipation of heat generated by semiconductor dice that are within the semiconductor die package 100. For example, in FIG. 1, a surface of a top clip structure 101 is exposed through the molding material 113 and is substantially coplanar with an exterior surface of the molding material 113. Also, as shown in FIG. 2, surfaces corresponding to a die attach pad 104, a common source lead 103, and a bottom clip structure 102 are exposed through the molding material 113 at the bottom surface of the semiconductor die package 100. Also partially exposed by the molding material 113 are leads 105a that are connected to a leadframe structure (not shown) and leads 105b that are connected to the top and bottom clip structures (101, 102) within the semiconductor die package 100.

In preferred embodiments of the invention, the top clip structure 101 is coupled to drain regions associated with a first pair of MOSFETs located within the semiconductor die package 100. The bottom clip structure 102 is coupled to drain regions associated with a second pair of MOSFETs located within the semiconductor die package 100.

Figure 3A:
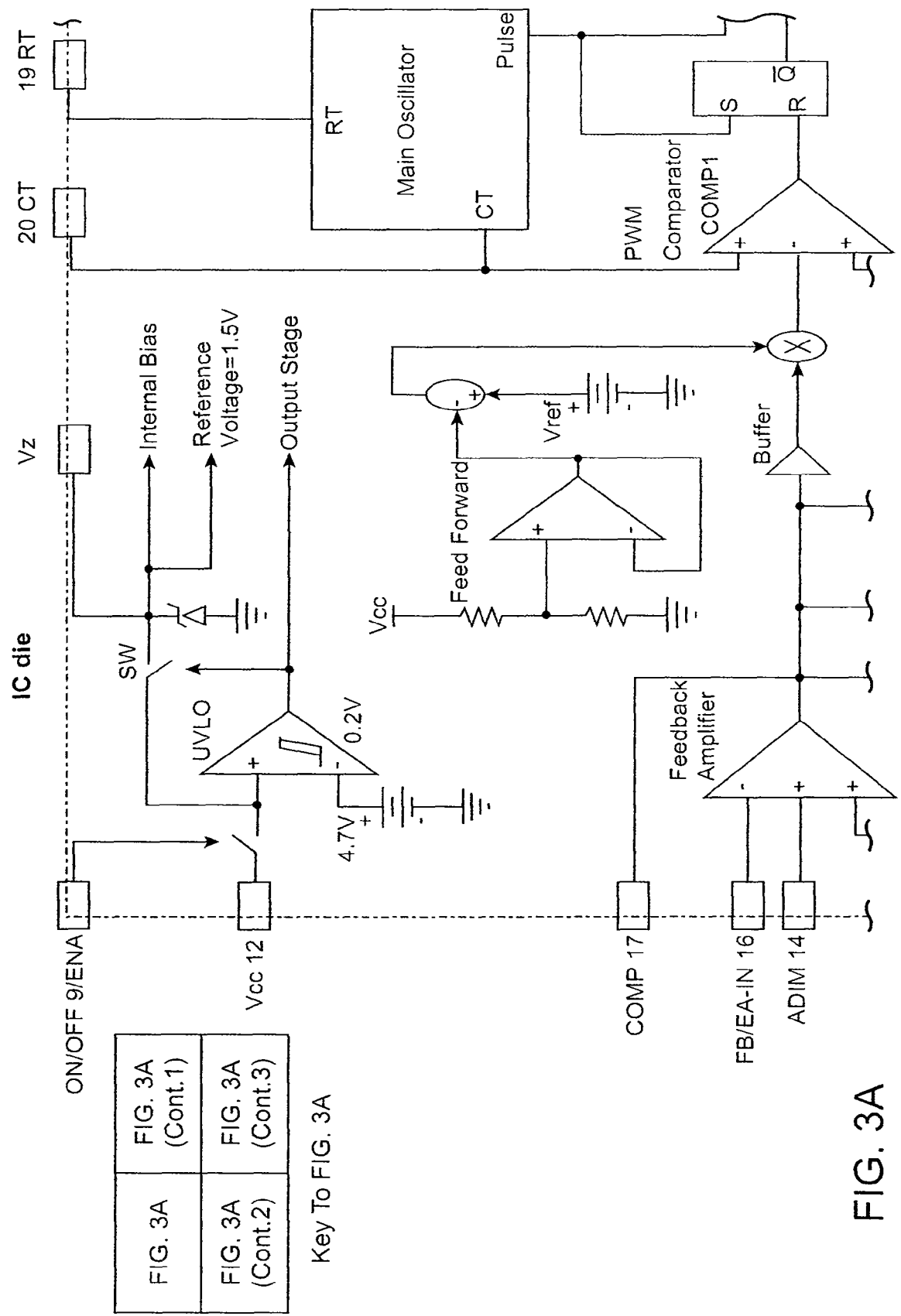
FIGS. 3A and 3B show exemplary circuit diagrams representing circuitry contained within an embodiment of a semiconductor die package.
Figure 3B:
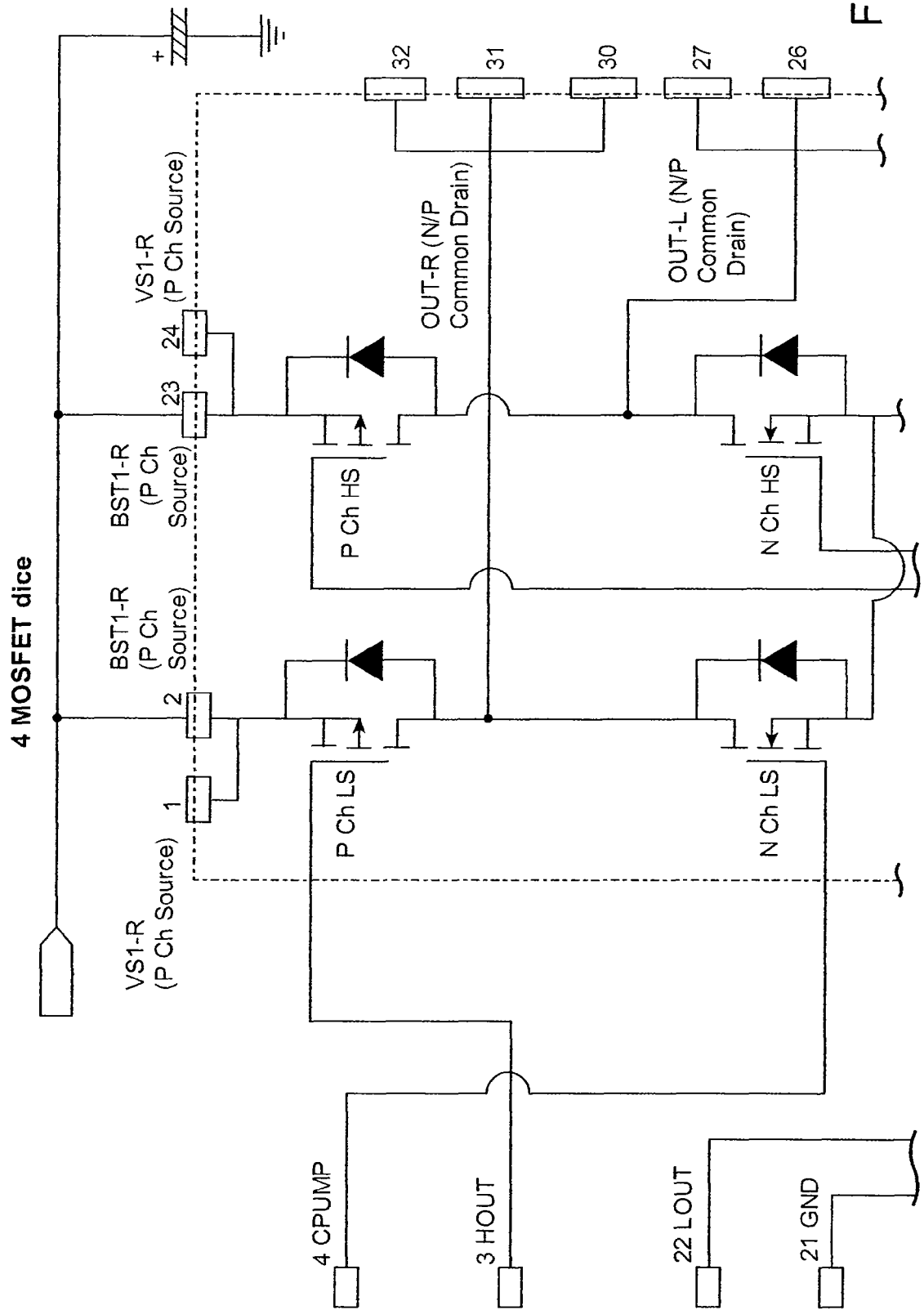
Figure 3B:
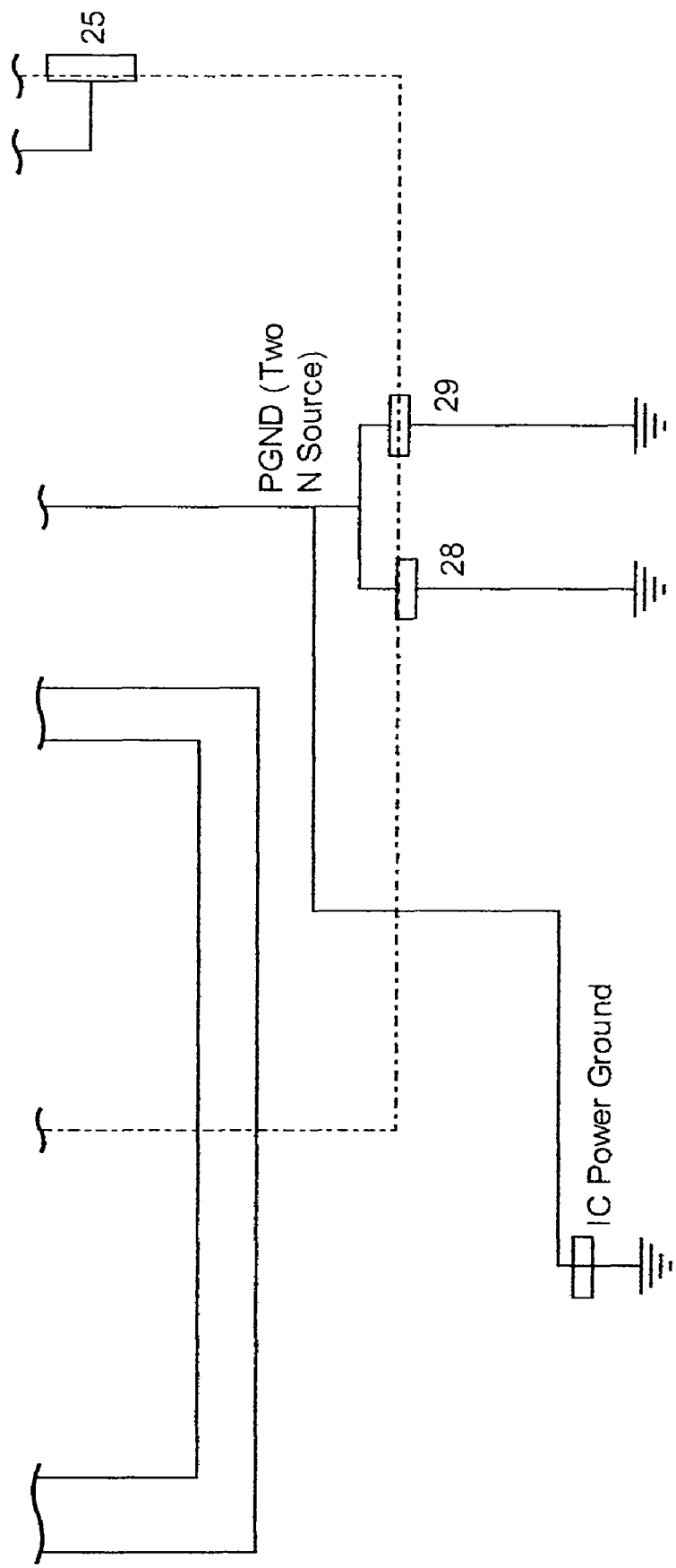

FIGS. 3A and 3B combined show an exemplary circuit diagram representing circuitry contained within a semiconductor die package according to an embodiment of the invention. FIG. 3A shows a diagram of an implementation of a driver circuit, which can be present in a driver integrated circuit die. An exemplary driver integrated circuit die may be FAN7310, which is commercially available from the assignee of the present application, Fairchild Semiconductor Corp. FIG. 3B shows a diagram of an implementation of a bridge circuit comprising four MOSFETs coupled together. The four MOSFETs include two p-channel MOSFETs and two n-channel MOSFETs. The four MOSFETs can be embodied in four semiconductor dice, and the four semiconductor dice are commercially available from Fairchild Semiconductor Corp. In preferred embodiments, the circuit of FIG. 3A is electrically coupled with the circuit of FIG. 3B within the package. The circuit diagrams in FIGS. 3A and 3B are just one embodiment of the invention, and other circuit types can be used.

FIGS. 4A-4E show various cutaway views of a semiconductor die package, which further illustrate the components of the package according to an embodiment of the invention. In these views, molding material 113 is semi-transparent to show internal package components.

Figure 4C:
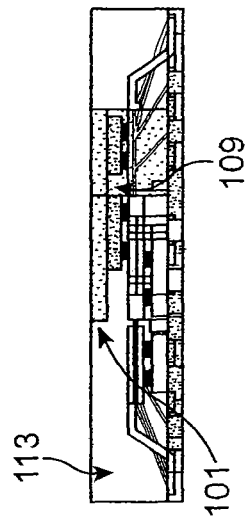
FIGS. 4A through 4E show partially transparent views of an embodiment of a semiconductor die package which illustrate the components of the package.
Figure 4D:
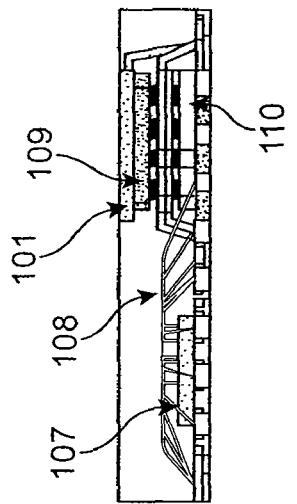
Figure 4A:
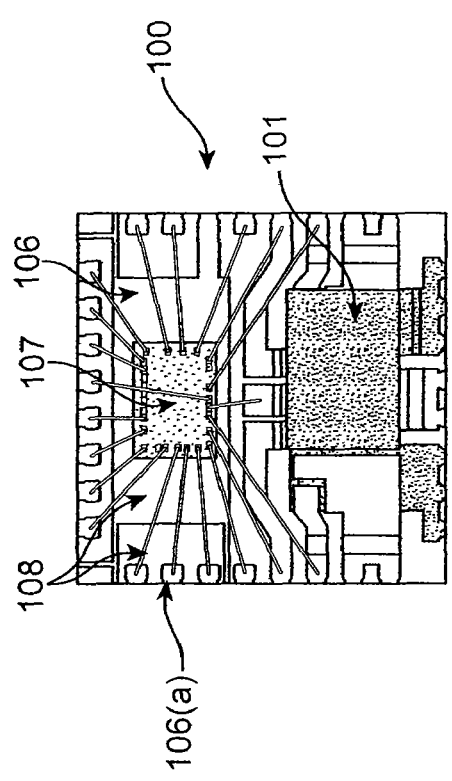
Figure 4B:
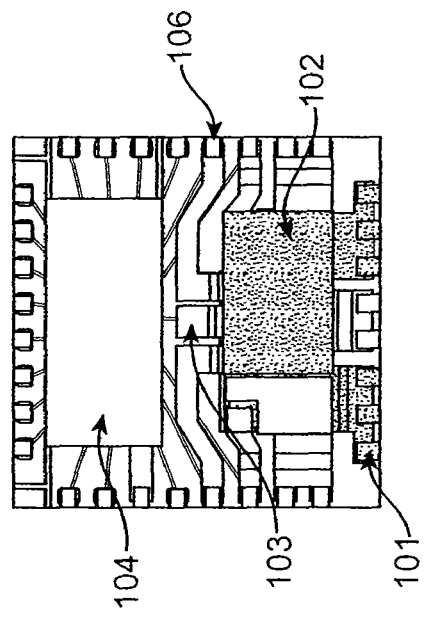

FIGS. 4A and 4B respectively show top and bottom views of a semiconductor die package 100 according to an embodiment of the invention. The semiconductor die package 100 includes a leadframe structure 106 including a common source lead 103. An integrated circuit die 107 is attached to a die attach pad 104 of the leadframe structure 106. In some embodiments of the invention, integrated circuit die 107 is a driver die, configured to drive backlight circuits for displays. The integrated circuit die 107 may be packaged or unpackaged. Bond wires 108 connect terminals in the integrated circuit die 107 to peripheral leads 106(a). In FIG. 4A, a first clip 101 is also illustrated and is laterally spaced from the integrated circuit die 107. In FIG. 4B, a second clip 102 is also illustrated and is laterally spaced from the die attach pad 104.

The term "leadframe structure" can refer to a structure that is derived from or is the same as a leadframe. Each leadframe structure can include two or more leads with lead surfaces and a die attach region. The leads extend laterally from the die attach region. A single lead frame structure may include a gate lead structure, and a source lead structure.

The leadframe structure may comprise any suitable material. Exemplary leadframe structure materials include metals such as copper, aluminum, gold, etc., and alloys thereof. The leadframe structures may also include plated layers such as plated layers of gold, chromium, silver, palladium, nickel, etc. The leadframe structure may also have any suitable thickness, including a thickness less than about 1 mm (e.g., less than about 0.5 mm).

The leadframe structure can be stamped, etched and/or patterned using conventional processes to shape the leads or other portions of the leadframe structure. For example, the leadframe structure can be formed by stamping, or by etching a continuous conductive sheet to form a predetermined pattern. If by etching, before or after etching the leadframe structure can also be optionally stamped so that a die attach surface of the leadframe structure is downset with respect to the lead surfaces of the leads of the leadframe structure. If stamping is used, the leadframe structure may be one of many leadframe structures in an array of leadframe structures that are connected by tie-bars. The leadframe structure array may also be cut to separate the leadframe structures from other leadframes structures. As a result of cutting, portions of a leadframe structure in a final semiconductor die package such as a source lead and a gate lead may be electrically and mechanically uncoupled from each other. Thus, a leadframe structure may be a continuous metallic structure or a discontinuous metallic structure.

FIGS. 4C and 4D show side views of the semiconductor die package embodiment shown in FIGS. 4A and 4B. A first set of semiconductor dice 109 comprising active devices can be attached to leadframe 106 and the first clip structure 101 using solder or some other type of conductive adhesive. A second set of semiconductor dice 110 comprising active devices is attached to an opposite surface of leadframe structure 106, and the second clip structure 102 using solder or some other type of conductive adhesive. In this example, integrated circuit die 107 is electrically coupled to the leadframe 106, the first set of semiconductor dice 109, and the second set of semiconductor dice 110 by bond wires 108.

The first set of semiconductor dice 109 is located between the leadframe structure 106 and the first clip structure 101. The second set of semiconductor dice 110 is located between the leadframe structure 106 and the second clip structure 102. The clip structures 101 and 102 may comprise copper, aluminum, or any other suitable metal that can conduct electricity. They may also be plated with other metals. They may be formed in any suitable manner (e.g., etching, stamping, etc.).

In preferred embodiments, the first set of semiconductor dice 109 and the second set of semiconductor dice 110 may each form at least part of half bridge circuits, and can be electrically coupled together to form at least part of a full bridge circuit. For example, each of first set of semiconductor dice and second set of semiconductor dice may comprise active devices. Active devices are components that are capable of controlling voltages or currents and can create a switching action in the circuit, and include transistors such as MOSFETs and bipolar junction transistors.

The first set of semiconductor dice 109 may include two MOSFET dice, preferably one P-channel MOSFET and one N-channel MOSFET. The second set of semiconductor dice 110 may include two MOSFET dice, preferably one P-channel MOSFET and one N-channel MOSFET. The integrated circuit die 107 is electrically coupled to both the first set of semiconductor dice 109 and the second set of semiconductor dice 110 through the leadframe structure 106 and bond wires 108. In a preferred aspect, the first set of semiconductor dice 109 is attached to an opposite surface of leadframe 106 from the second semiconductor dice 110. The first set of semiconductor dice 109 and the second set of semiconductor dice 110 can be in a stacked relationship.

Figure 4E:
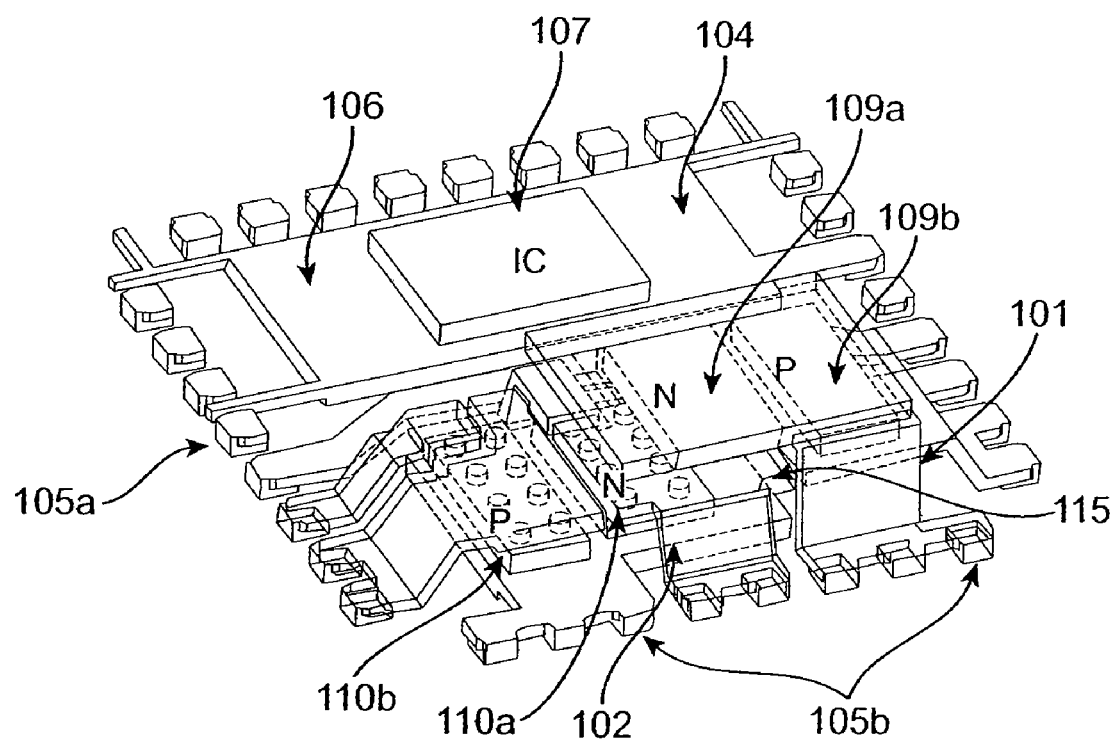

FIG. 4E shows a top perspective view of some components of a semiconductor die package according to an embodiment of the invention. Integrated circuit die 107 is attached to die attach pad 104 of leadframe 106, which further attaches to a bridge circuit 115. Bridge circuit 115 can include a plurality of semiconductor dice, including the first set of semiconductor dice 109 and the second set of semiconductor dice 110. The first set of semiconductor dice 109 can comprise an N-channel MOSFET die 109a, and a P-channel MOSFET die 109b. Likewise, the second set of semiconductor dice 110 can comprise an N-channel MOSFET die 110a, and a P-channel MOSFET die 110b. The first and second sets of semiconductor dice 109, 110 may be attached to clip structures 101 and 102.

Output connections for the semiconductor die package can be provided by leads 105b connected to clip structures 101 and 102, and leads 105a (which form part of the leadframe 106). Leads 105a and 105b can be exposed by molding material 113, as shown in FIG. 2, which allows for electrical connection to other circuitry. Leadframe 106 further includes a common source lead 103. In certain embodiments, common source lead 103 is electrically coupled to a contact point of the source electrode of N-channel MOSFET die 109a and also to a contact point of the source electrode of N-channel MOSFET die 110a.

Bridge circuit 115 can include any suitable configuration of devices, including active devices. The first set of semiconductor dice 109 can comprise a first set of active devices and the second set of semiconductor dice 110 can comprise a second set of active devices, which together can form a part of bridge circuit 115. In preferred embodiments, bridge circuit 115 is a full bridge circuit that can comprise transistors such as 4 MOSFETs in an H-configuration. In another exemplary embodiment, bridge circuit 115 can comprise bipolar junction transistors. In another exemplary embodiment, semiconductor dice 109 and 110 can together form a part of bridge circuit 115. In this embodiment, the plurality of semiconductor dice 109 and 110 can each comprise an active device, and the remainder of bridge circuit 115 (i.e., the other active devices needed to form a bridge circuit) can be implemented in a circuit connected to the semiconductor package. In a further exemplary embodiment, bridge circuit 115 can comprise a half bridge circuit. In this example, the first set of semiconductor dice 109 comprising a first set of active devices and the second set of semiconductor dice 110 comprising a second set of active devices can each form at least a portion of a half bridge circuit.

Some embodiments of the invention are directed to methods of making semiconductor die packages. In one embodiment, the method comprises: obtaining a leadframe structure; attaching a plurality of semiconductor dice comprising a plurality of active devices to the leadframe structure, wherein the plurality of active devices form at least part of a bridge circuit; and attaching an integrated circuit die to the leadframe structure. Additional process details are provided below with reference to FIGS. 5A-5B and 6A-6B. Although one semiconductor die package is shown in FIGS. 5A-5B and 6A-6B, the semiconductor die package may be formed in an array and in parallel with a number of other packages. In addition, although one bridge circuit and one integrated circuit die are mentioned for simplicity of illustration, there may be multiple semiconductor dice, circuits, clip structures, etc. within a single die package in other embodiments of the invention.

Figure 5A:
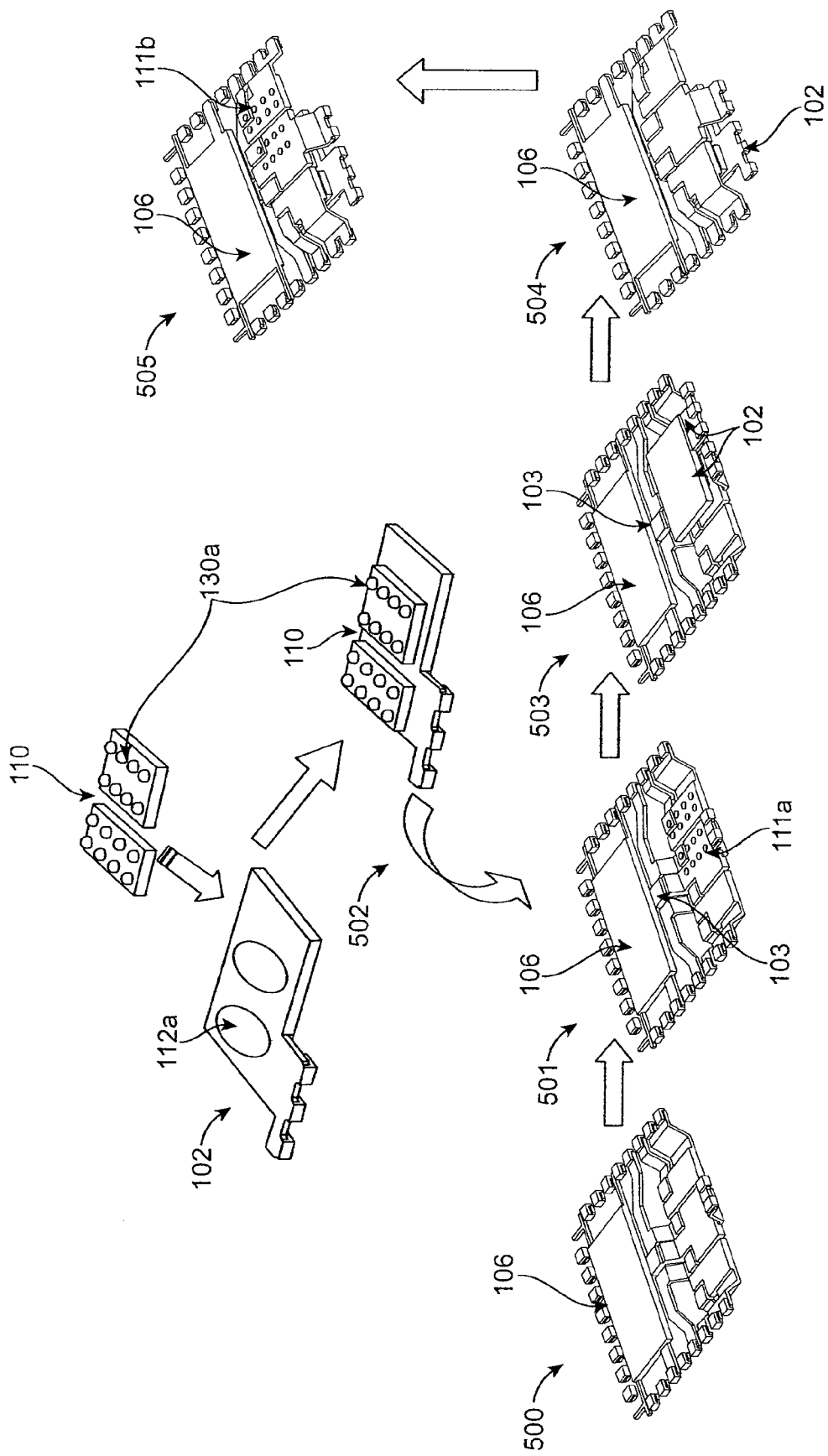
FIGS. 5A through 5B illustrate a method of manufacturing a semiconductor die package according to a first embodiment.
Figure 5B:
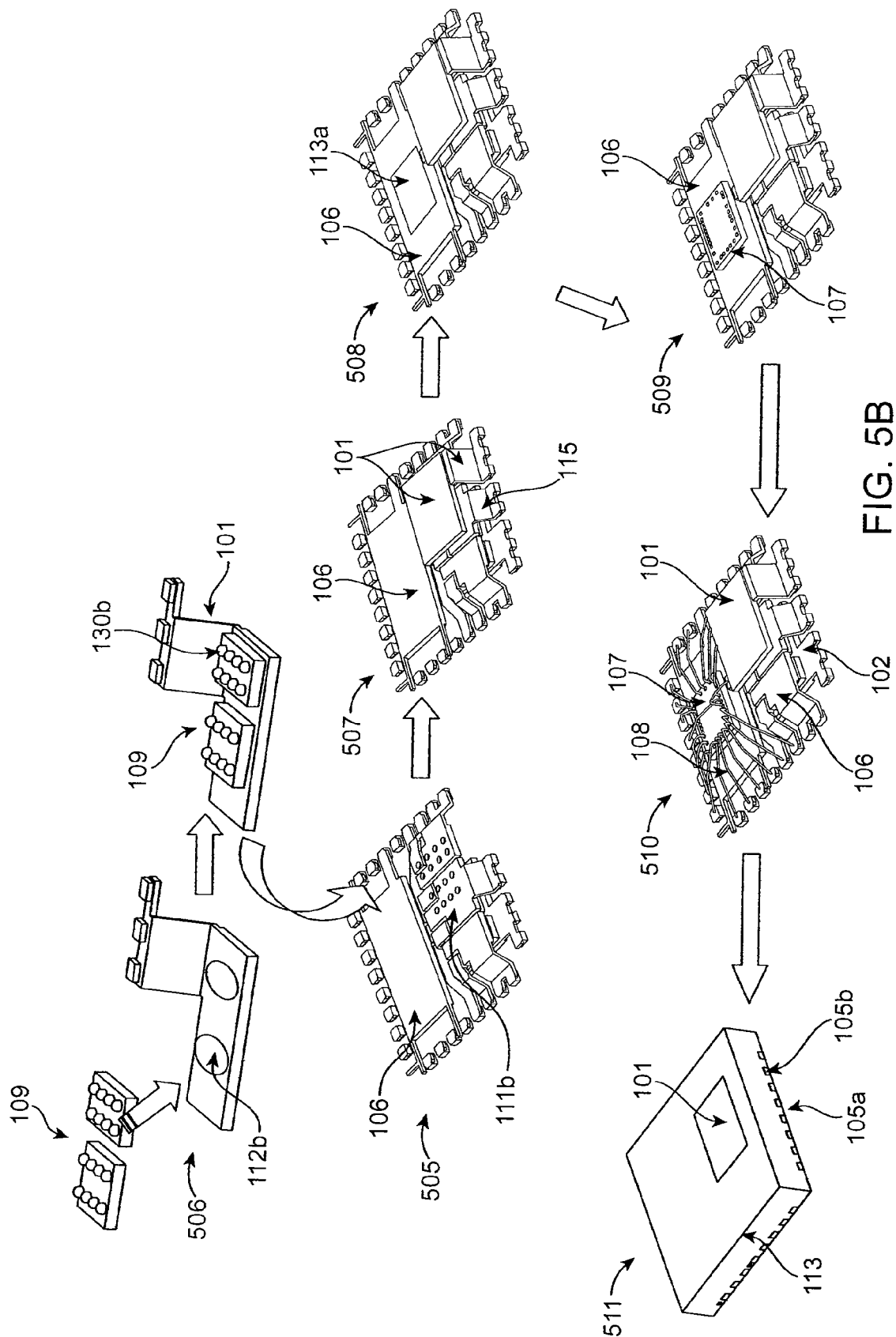

FIGS. 5A-5B illustrate a method of manufacturing a semiconductor die package according to one embodiment of the invention. As shown by both FIGS. 5A-5B and 6A-6B, the described steps may take place in any suitable order. In step 500, a leadframe 106 is obtained. The leadframe 106 can be manufactured by any suitable method. Leadframe structures can be formed by, for example, stamping processes which are known in the art. Leadframe structures can also be formed by etching a continuous conductive sheet to form a predetermined pattern. Exemplary leadframe structure materials include metals such as copper, aluminum, etc., and alloys thereof. The leadframe structures may also include plated layers such as plated layers of gold, chromium, silver, palladium, nickel, etc.

Solder paste 111a can be printed on the back surface of the obtained leadframe 106 in step 501. Concurrently, in step 502 a second set of semiconductor dice 110, which can comprise an N-channel MOSFET die and a P-channel MOSFET die, can be attached to clip structure 102, preferably using soft solder 112a. Semiconductor dice 110 may be coated on a surface with solder bumps 130a to assist with attaching the dice 110 to leadframe 106. In step 503, the clip structure 102 and the second set of semiconductor dice 110 are attached to a bottom surface of leadframe structure 106, preferably by a flip chip bonding method. In this method, the clip structure 102 is inverted, and placed on the leadframe structure 106. The resulting structure is heated so that solder paste 111a and solder bumps 130a reflow to physically couple the second set of semiconductor dice 110 to the leadframe structure 106. The solder paste 111a also electrically couples second set of semiconductor dice 110 to leadframe structure 106. As can be seen in steps 501 and 503, this includes the common source lead 103. In some embodiments, common source lead 103 is coupled by the solder paste 111a to a contact point on a source electrode of the N-channel MOSFET in half bridge 110. Once the second set of semiconductor dice 110 and clip structure 102 are attached, the leadframe structure 106 is turned over in step 504, exposing the opposite surface (i.e. the top surface) of the leadframe structure 106.

In step 505, solder paste 111b can be printed on a top surface of leadframe structure 106. In step 506, the first set of semiconductor dice 109, which can comprise an N-channel MOSFET die and a P-channel MOSFET die can be attached to a clip structure 101, preferably using soft solder 112b. Semiconductor dice 109 may be coated on a surface with solder bumps 130b to assist with attaching the dice 109 to leadframe 106. In step 507, the clip structure 101 and first set of semiconductor dice 109 are attached to leadframe structure 106, preferably by a flip chip bonding method. This step can create an electrical connection between first set of semiconductor dice 109 and the second set of semiconductor dice 110, which together can form at least part of a bridge circuit 115.

Then, in step 508, a die attach 113a is attached to leadframe structure 106. Die attach 113a can comprise a non-conductive adhesive or die attach tape, or other suitable non-conductive bonding material known in the art. After this step, a first structure 107 comprising an integrated circuit die is attached to the leadframe 106 via the die attach 113a in step 509. Once attached, the integrated circuit die is electrically coupled to the rest of the package by wire bonding, in step 510.

After wire bonding, in step 511 a molding material 113 is molded around the package, and the package is separated and prepared such that it is ready for use in applications. The molding material may be molded using conventional molding processes. Suitable molding temperature and pressures may be determined by those of ordinary skill in the art. Once the package is molded, a deflash process can be performed to remove excess molding material. As shown in step 511, after the deflash process, the molding material 113 exposes certain areas for electrical or thermal connection, such as portions of clip structure 101 and leads 105a and 105b.

Figure 6A:
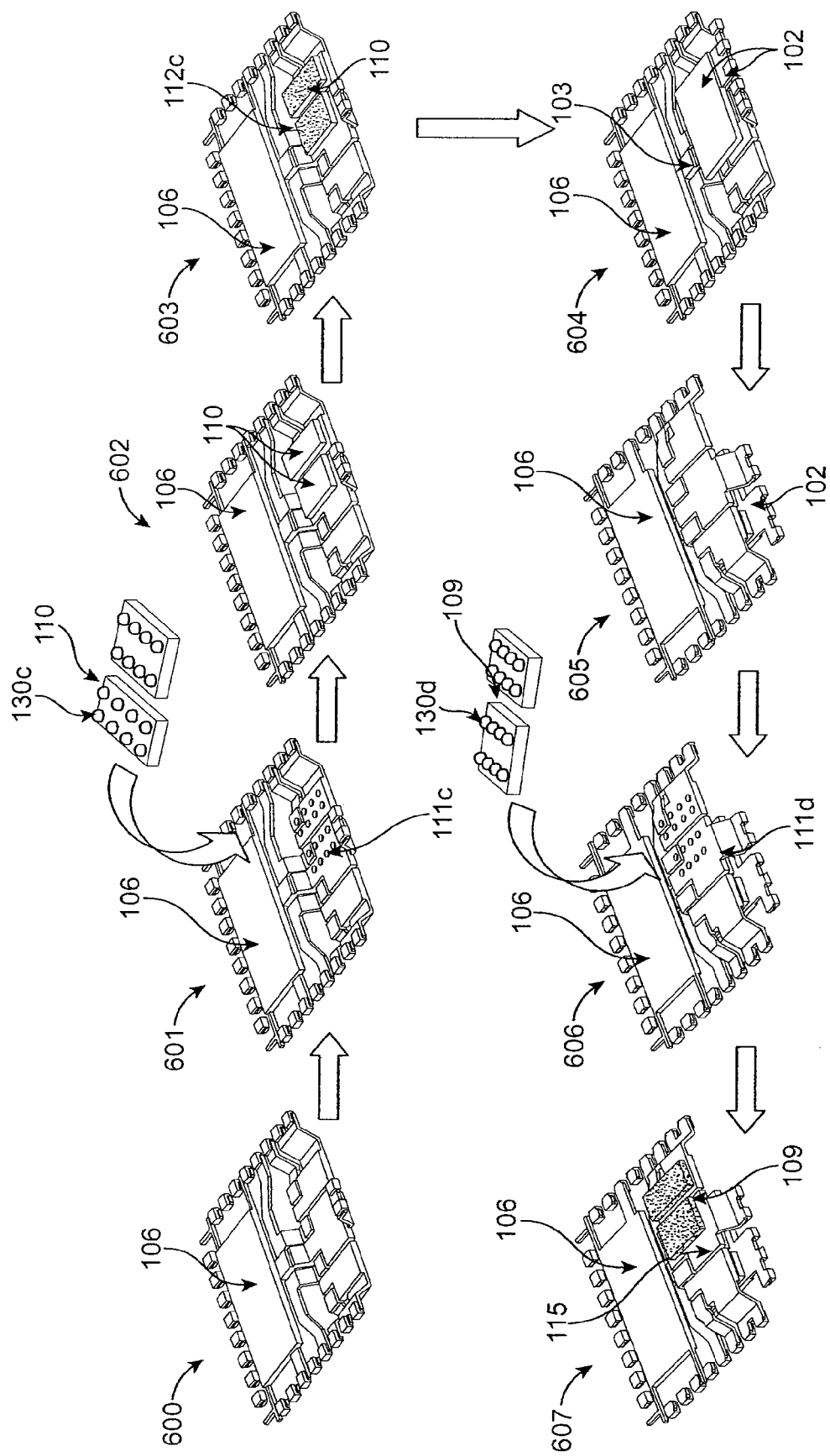
FIGS. 6A through 6B illustrate a method of manufacturing a semiconductor die package according to a second embodiment.
Figure 6B:
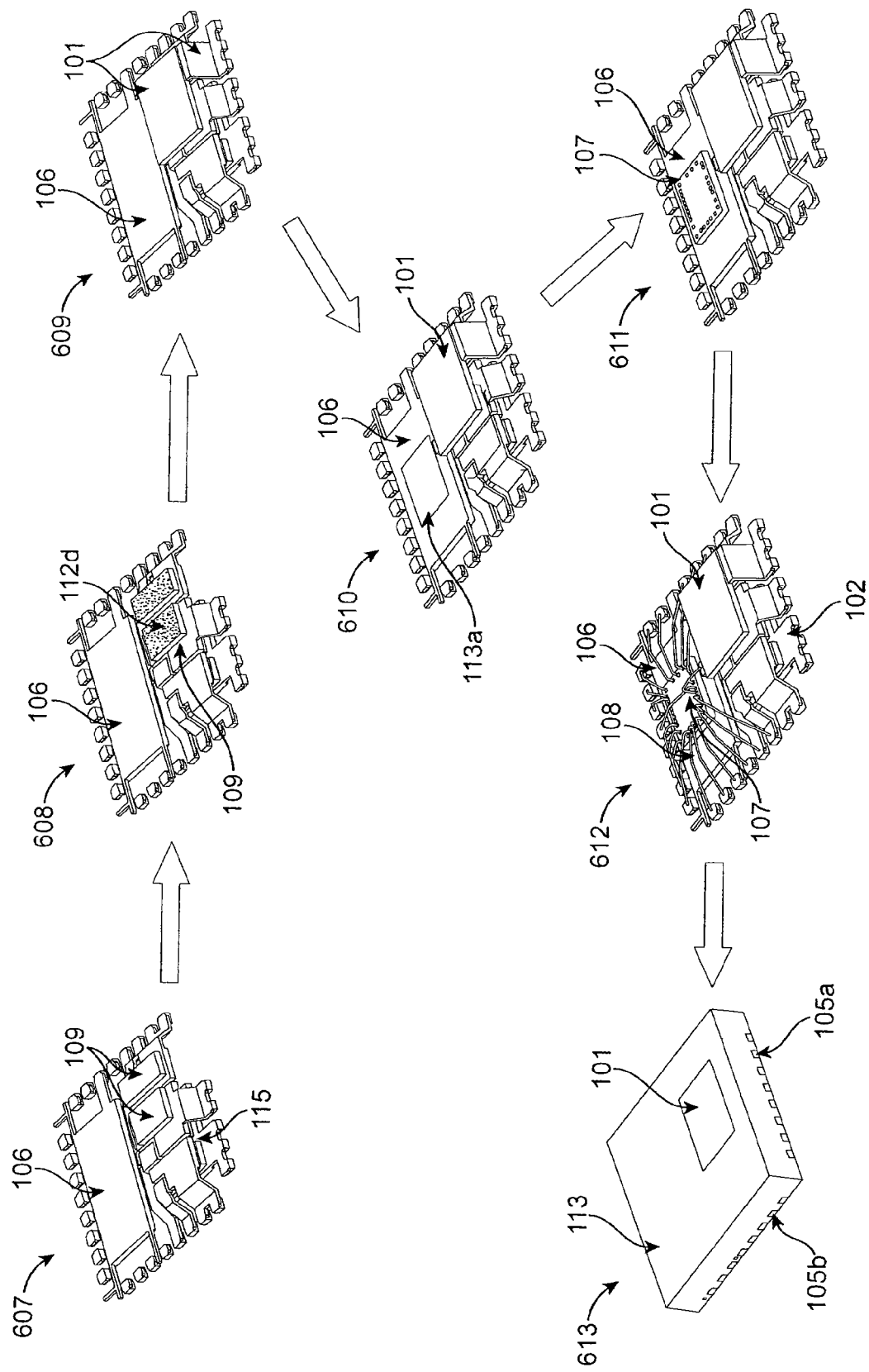

FIGS. 6A-6B illustrate an alternative embodiment of manufacturing a semiconductor die package according to the invention. In step 600, a leadframe structure 106 is obtained. Solder paste 111c can be printed on the back surface of the leadframe structure 106 in step 601. In step 602, a second set of semiconductor dice 110, which can comprise an N-channel MOSFET die and a P-channel MOSFET die, is attached to a bottom surface of leadframe 106, preferably by a flip chip method. Semiconductor dice 110 may first be coated on a surface with solder bumps 130c to assist with attaching the dice 110 to leadframe 106. Then, in step 603, soft solder 112c can be attached to an outwardly facing surfaces of the second set of semiconductor dice 110. Using soft solder 112c, a clip structure 102 is then attached to second set of semiconductor dice 110 in step 604. Once the clip structure 102 is attached, the leadframe structure 106 is turned over in step 605 exposing the opposite surface (i.e. the top surface).

In step 606, solder paste 111d can be printed on a top surface of leadframe structure 106. In step 607 a first set of semiconductor dice 109, which can comprise an N-channel MOSFET die and a P-channel MOSFET die, can be attached to the top surface of leadframe structure 106, preferably by a flip chip bonding process. Semiconductor dice 109 may first be coated on a surface with solder bumps 130d to assist with attaching the dice 109 to leadframe 106. This step can create an electrical connection between first set of semiconductor dice 109 and the second set of semiconductor dice 110, which together can form at least a portion of a bridge circuit 115. Furthermore, common source lead 103 of the leadframe structure 106 can be electrically coupled to a contact point of the source electrode of an N-channel MOSFET die in the first set of semiconductor dice 109 and also to a contact point of the source electrode of N-channel MOSFET die in second set of semiconductor dice 110.

Then, in step 608, soft solder 112d can be attached to an outwardly facing surface of device 109. Using soft solder 112d, a clip structure 101 is then attached to the first set of semiconductor dice 109 in step 609. Next, in step 610, a non-conductive die attach 113a is attached to leadframe structure 106. After this, an integrated circuit die 107 is attached to the leadframe structure 106 via the die attach 113a in step 611. Once attached, the integrated circuit die 107 is electrically coupled to the rest of the package by wire bonding, in step 612.

After wire bonding, in step 613 a molding material 113 is molded around the package, and the package is separated and prepared such that it is ready for use in applications. The molding material may be molded using conventional molding processes. Suitable molding temperature and pressures may be determined by those of ordinary skill in the art. Once the package is molded, a deflash process can be performed to remove excess molding material. As seen in step 613, after the deflash process, the molding material leaves exposed certain areas for electrical or thermal connection, such as clip structure 101 and leads 105a and 105b.

Described above are exemplary embodiments of methods of manufacturing. However, embodiments of the semiconductor die package can be formed by other suitable processes. For example, various devices such as the integrated circuit die, the bridge dice, and the clip structures may be attached to the leadframe and each other by any suitable process. Suitable processes may include flip chip bonding, wire bumps, conductive paste, etc. In a further exemplary embodiment, bridge circuit 115 can comprise a half bridge circuit. In this example, devices 109 and 110 can each comprise a portion of the half bridge circuit, such as each comprising a single switching transistor.

Figure 7:
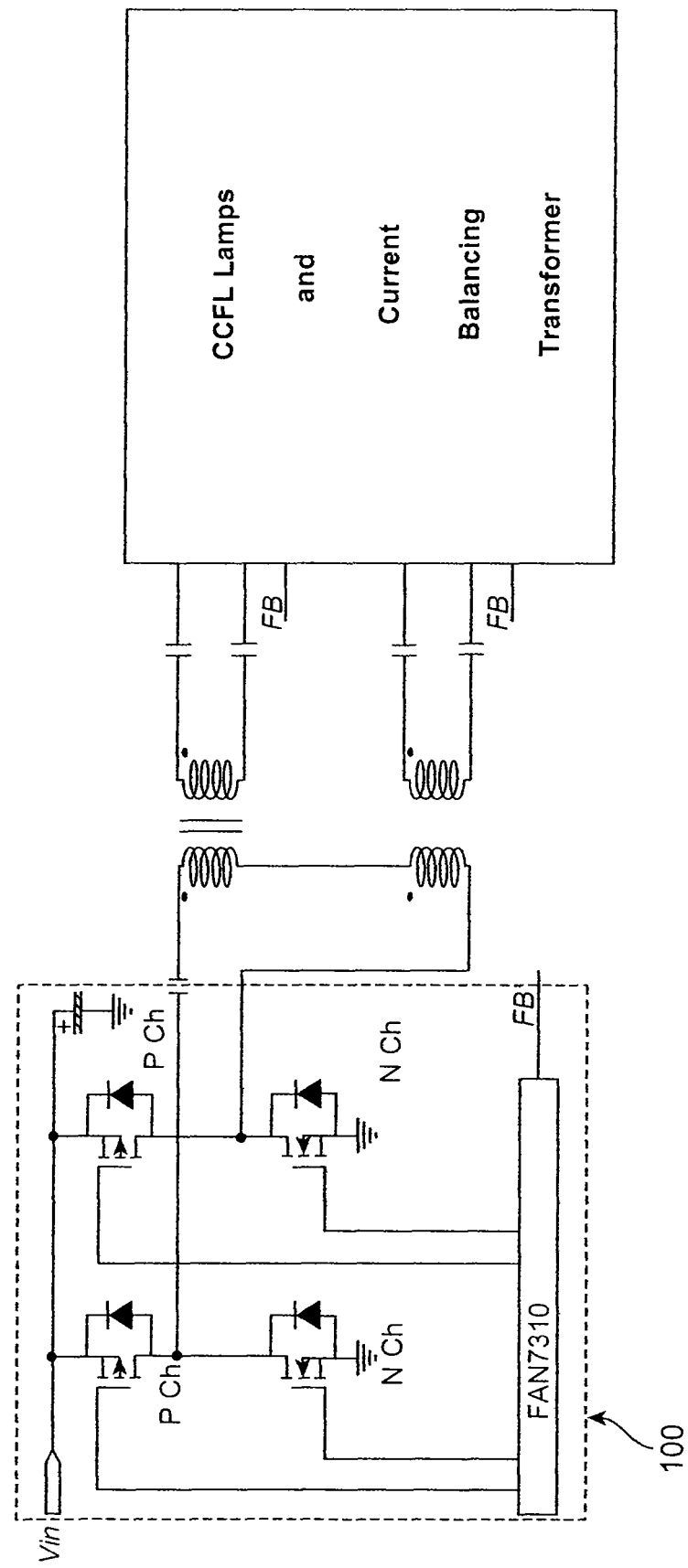
FIG. 7 shows a high-level application of an embodiment of a semiconductor die package.
Figure 8:
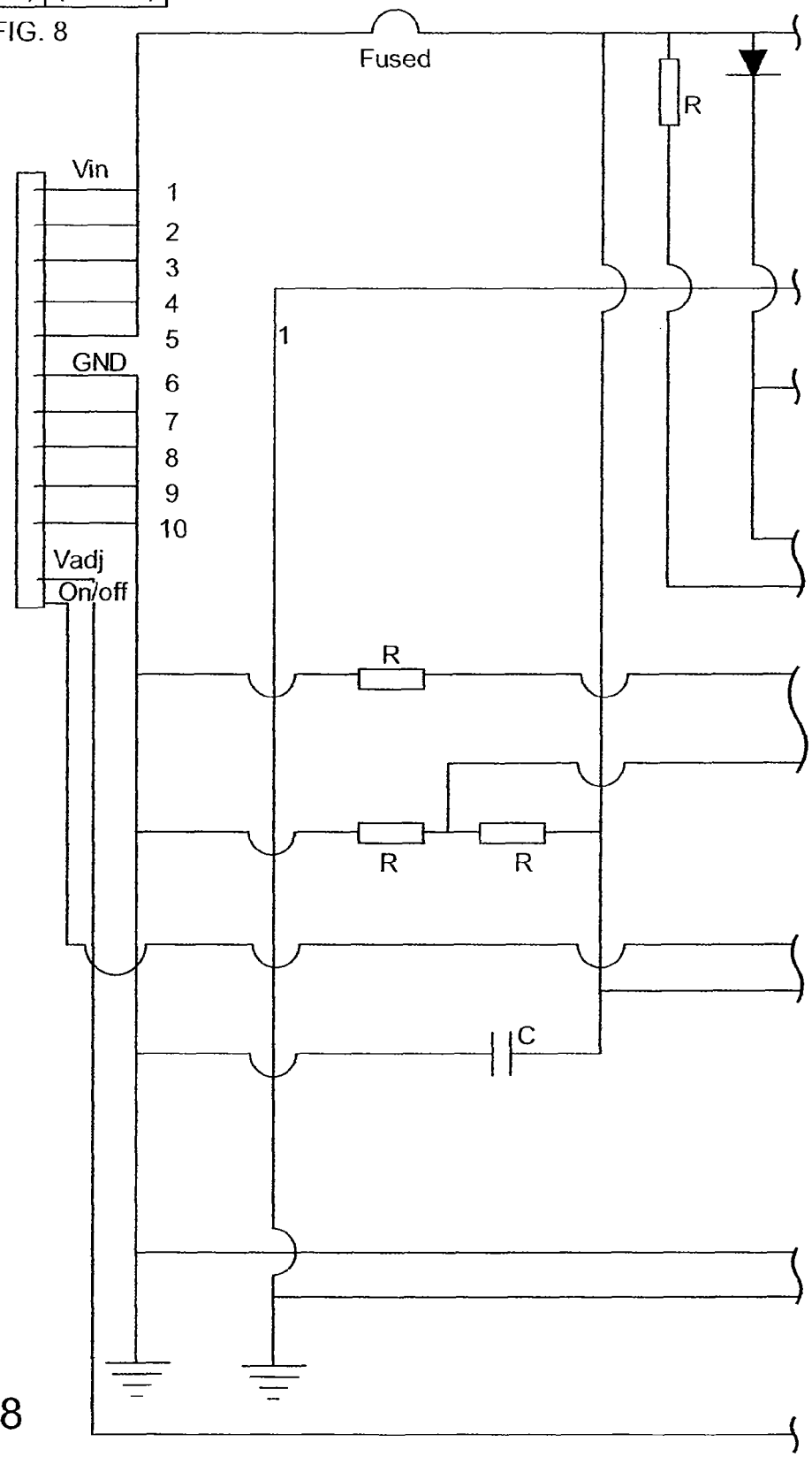
FIG. 8 shows a circuit diagram implementing the application of FIG. 7.
Figure 8:
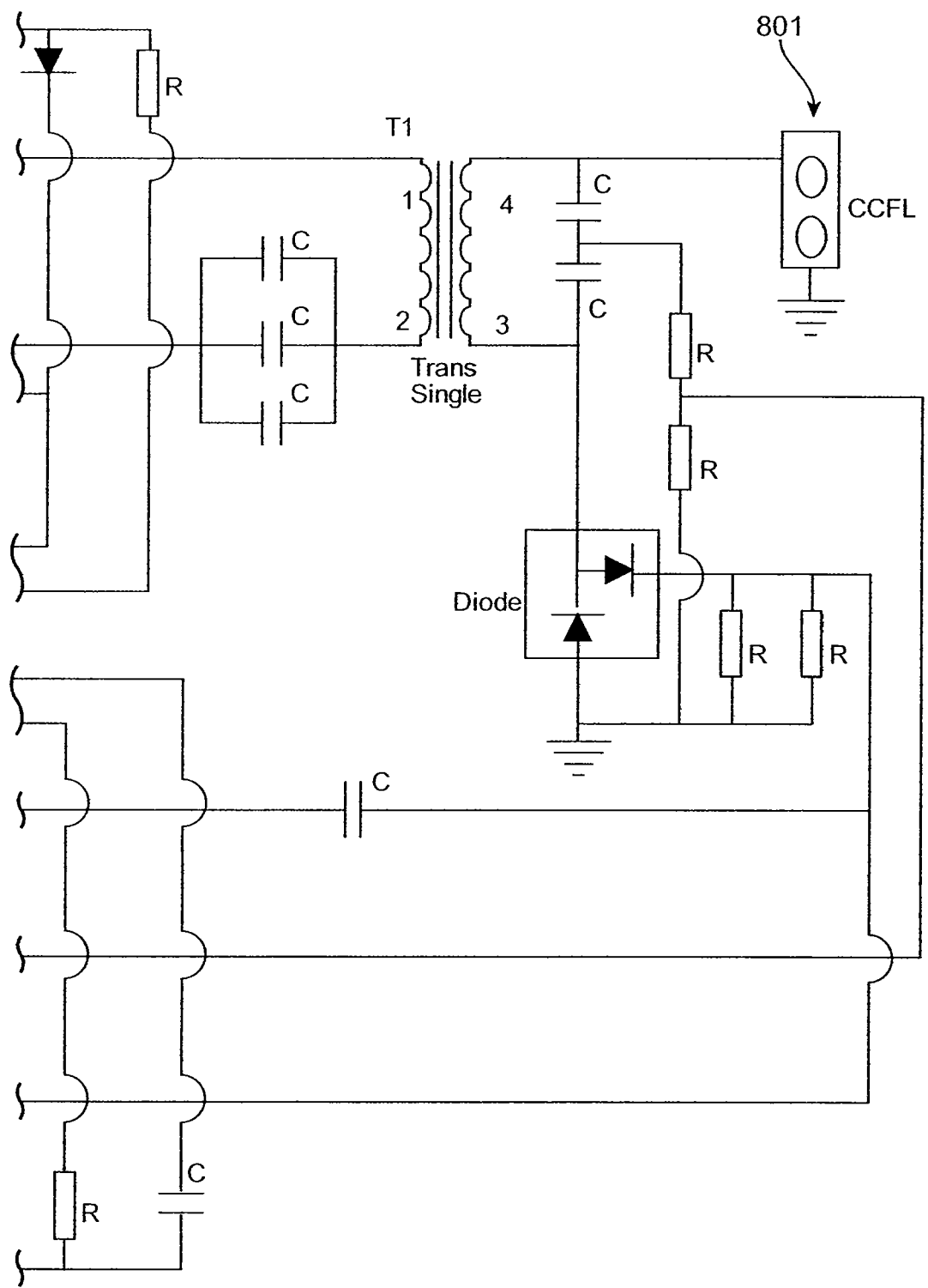

FIG. 7 shows a use of the semiconductor die package according to an embodiment of the invention. In this embodiment, semiconductor die package 100 is part of a backlight inverter circuit, which drives a backlight for LCD applications. FIG. 8 shows a circuit diagram that is an implementation of FIG. 7. In this example, semiconductor die package 100 is part of a backlight inverter circuit that drives CCFL 801. Table I discloses the pin-out configuration of semiconductor die package 100 in FIG. 8:

TABLE I

| Pin No | Name | Description |
|---|---|---|
| 1 | VS1-R | Voltage floating supply return 1 |
| 2 | BST1-R | Boot strap power supply for high side driver 1 |
| 3 | P Gate-R | Link to external power driver |
| 4 | N Gate-R | n/a |
| 5 | SYNC | Synchronization input signal |
| 6 | GND | DAP of IC |
| 7 | UVLS/OLP | Power line input under-voltage lock-out detection |
| 8 | ISEN/OLR | Lamp current sense |
| 9 | ENA | IC enable |
| 10 | S_S | Timing capacitor to set soft-start |
| 11 | TIMER/GND | Capacitor setting striking time and OCP, OLP, OVP shutdown delay timer |
| 12 | VIN | Input power |
| 13 | REF | Reference voltage |
| 14 | ADIM | Analog dimming input |
| 15 | BDIM | Burst dimming input |
| 16 | VSEN/EA_IN | Lamp voltage feedback |
| 17 | COMP/EA_OUT | Voltage control loop compensation |
| 18 | BCT | Burst dimming timing capacitor |
| 19 | RPT/RT | Synchronization |
| 20 | CT | High frequency oscillator timing capacitor for operation clock and striking frequency |
| 21 | N Gate-L | n/a |
| 22 | P Gate-L | Link to external power driver |
|  | PGND | POWER ground into two N DAP in package bottom |
| 23 | BST2-L | Boot strap power supply for high side driver 2 |
| 24 | VS-L | Voltage floating supply return 2 |
| 25 | OUT-L | Output to load (Tankcircuit), N/P common drain |
| 26 | OUT-L |  |
| 27 | OUT-L |  |
| 28 | PGND | POWER ground. Two Nch common source. |
| 29 | PGND |  |
| 30 | OUT-R | Output to load (Tankcircuit), N/P common drain, |
| 31 | OUT-R |  |
| 32 | OUT-R |  |

Figure 9:
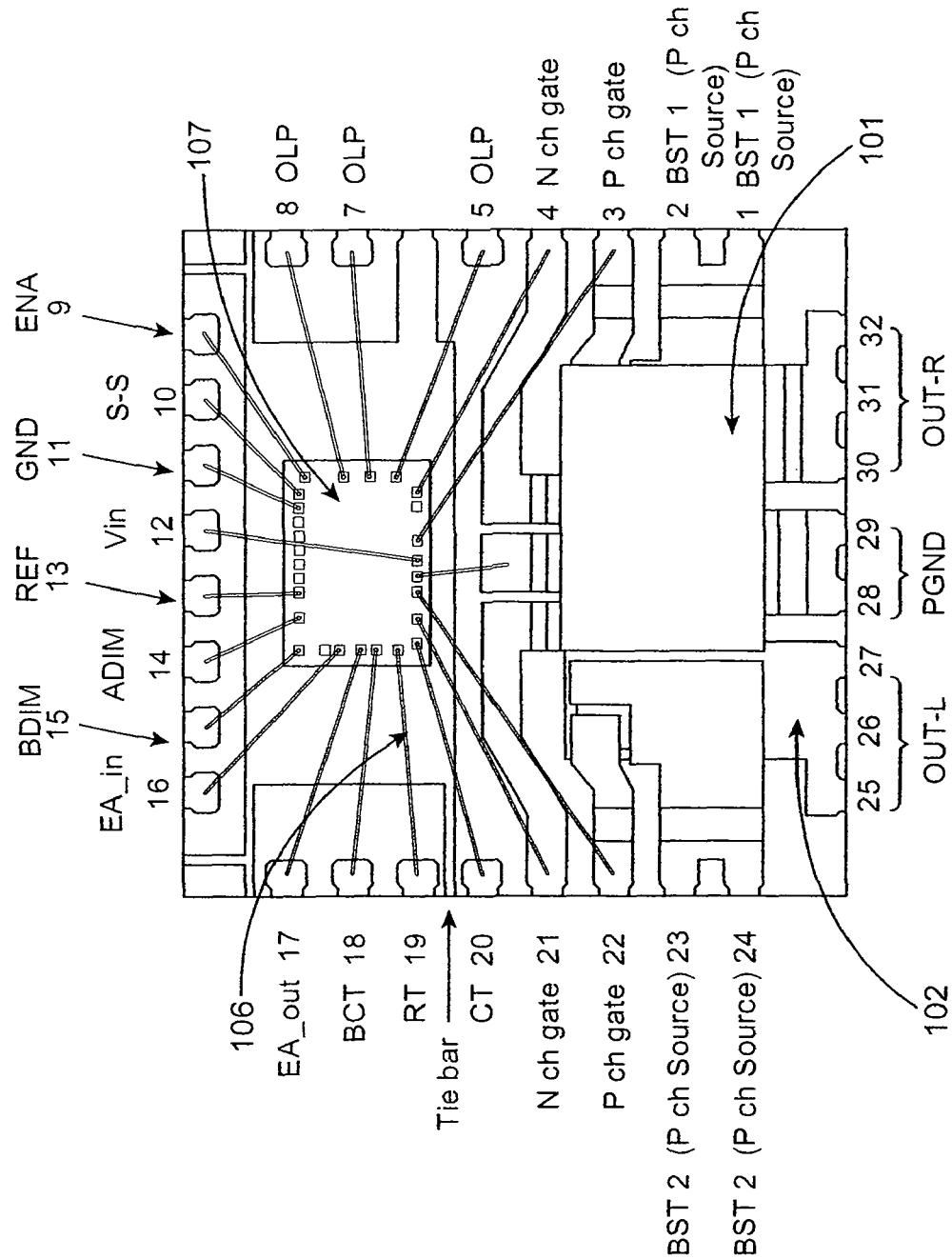
FIG. 9 shows a configuration for a semiconductor die package according to an embodiment of the invention.

FIG. 9 shows a pin-out configuration for another embodiment of the invention. In FIG. 9, a leadframe structure 106 is attached to an integrated circuit die 107 and a plurality of semiconductor dice (not shown). Output connections are provided by leadframe 106, and also by clip structures 101 and 102. Other pin-out configurations may be contemplated.

Embodiments of the invention are not limited to such uses as in FIGS. 7, 8, and 9 however, and other uses of embodiments of the invention may be contemplated. For example, exemplary embodiments may be mounted to circuit boards along with other components in electrical systems such as computer systems, servers, wireless phones, televisions, power supplies, etc.

Embodiments of the invention are robust and stable. Aspects of the semiconductor die package provide greater packaging efficiencies than previously encountered, as well as excellent thermal performance due to the exposed IC die attach pad and clip structures. This allows for smaller space requirements, cost savings, and easier manufacturing procedures for applications such as LCD electronics. Furthermore, in exemplary embodiments, the placement of a half bridge circuit on each of opposite surfaces of the leadframe creates more stable and rigid circuitry. In such placement, the clip structures can be exposed by the molding material on both the back and front sides of the package, allowing for good thermal performance.

As used herein "top" and "bottom" surfaces are used in the context of relativity with respect to a circuit board upon which the semiconductor die packages according to embodiments of the invention are mounted. Such positional terms may or may not refer to absolute positions of such packages.

The semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

What is claimed is:

1. A semiconductor die package comprising:
    a leadframe structure;
    an integrated circuit die attached to the leadframe structure; and
    a plurality of semiconductor dice comprising a plurality of active devices, the plurality of active devices comprising a first pair of MOSFET dice attached to a first surface of the leadframe structure and a second pair of MOSFET dice attached to a second surface of the leadframe structure, wherein the plurality of semiconductor dice form at least part of a bridge circuit,
    further wherein the first surface of the leadframe structure is opposite to the second surface of the leadframe structure.

2. The semiconductor die package of claim 1 further comprising a plurality of bond wires bonded to the integrated circuit die, wherein the plurality of bond wires electrically couple the plurality of active devices to the integrated circuit die.

3. The semiconductor die package of claim 1, wherein the leadframe structure includes a die attach pad, wherein the integrated circuit die is attached to the die attach pad, wherein the semiconductor die package further comprises:
    a molding material covering at least part of the leadframe structure.

4. The semiconductor die package of claim 1, wherein the integrated circuit die comprises an integrated circuit driver die.

5. The semiconductor die package of claim 1, wherein the at least part of a bridge circuit is a full bridge circuit.

6. The semiconductor die package of claim 5, wherein the plurality of active devices include two N-channel MOSFETs and two P-channel MOSFETs, and wherein the semiconductor die package further comprises a common source structure configured to connect a first contact point on a source electrode of a first N-channel MOSFET to a second contact point on a source electrode of a second N-channel MOSFET.

7. The semiconductor die package of claim 1, further comprising at least one clip structure electrically coupled to the plurality of active devices.

8. The semiconductor die package of claim 7, further comprising a molding material covering at least part of the leadframe structure, wherein portions of the at least one clip structure are exposed by the molding material.

9. The semiconductor die package of claim 1, wherein the first pair of MOSFET dice are connected to a first clip structure and the second pair of MOSFET dice are connected to second clip structure, wherein the semiconductor die package further comprises:
    a molding material covering at least part of the leadframe structure, the integrated circuit die, and the bridge circuit, wherein portions of the first clip structure and portions of the second clip structure are exposed by the molding material.

10. An LCD backlight inverter comprising the semiconductor die package of claim 1.

11. A method of forming a semiconductor die package, the method comprising:
    obtaining a leadframe structure;
    attaching a first set of semiconductor dice to a first clip structure, the first set of semiconductor dice comprising a first set of MOSFETs;
    attaching the first set of semiconductor dice to a first surface of the leadframe structure;
    attaching a second set of semiconductor dice to a second clip structure, the second set of semiconductor dice comprising a second set of MOSFETs;
    attaching the second set of semiconductor dice to a second surface of the leadframe structure, wherein the second surface of the leadframe structure is opposite to the first surface of the leadframe structure, and wherein the first set of MOSFETs and the second set of MOSFETs form at least part of a bridge circuit; and
    attaching an integrated circuit die to the leadframe structure.

12. The method of claim 11, wherein each of the first set and second set of MOSFETs comprises a N-channel MOSFET and a P-channel MOSFET.

13. The method of claim 11, further comprising:
    molding a molding material around the leadframe structure, the integrated circuit die, and the bridge circuit, wherein the molding material leaves exposed portions of the first clip structure and portions of the second clip structure.

14. The method of claim 13, wherein portions of the first clip structure are left exposed on a front side of the semiconductor die package, and portions of the second clip structure are left exposed on a back side of the semiconductor die package opposite to the front side.

15. The method of claim 11, wherein the leadframe structure comprises copper.

16. The method of claim 15, further comprising:
    molding a molding material around the leadframe structure.

17. The method of claim 11, wherein the integrated circuit die comprises a driver integrated circuit die.

18. The method of claim 11, wherein the bridge circuit is a full bridge circuit.

19. A semiconductor die package comprising:
    a leadframe structure;
    a first set of transistors attached to a first surface of the leadframe structure; and
    a second set of transistors attached to a second surface of the leadframe structure opposite to the first surface of the leadframe structure, wherein the first set of transistors and the second set of transistors form a full bridge circuit.

20. A method of forming a semiconductor die package, the method comprising:

obtaining a leadframe structure;
attaching a first set of transistors to a first surface of the leadframe structure; and
attaching a second set of transistors to a second surface of the leadframe structure opposite to the first surface of the leadframe structure, wherein the first set of transistors and the second set of transistors form a full bridge circuit.

* * * * *